US010126166B2

(12) United States Patent
Sugawa et al.

(10) Patent No.: US 10,126,166 B2
(45) Date of Patent: Nov. 13, 2018

(54) SOLID LIGHT-RECEIVING DEVICE FOR UV LIGHT

(71) Applicant: TOHOKU UNIVERSITY, Miyagi (JP)

(72) Inventors: Shigetoshi Sugawa, Miyagi (JP); Rihito Kuroda, Miyagi (JP)

(73) Assignee: Tohoku University, Miyagi (JP)

( * ) Notice: Subject to any disclaimer, the term of this patent is extended or adjusted under 35 U.S.C. 154(b) by 55 days.

(21) Appl. No.: 15/300,025

(22) PCT Filed: Mar. 31, 2014

(86) PCT No.: PCT/JP2014/059553
§ 371 (c)(1),
(2) Date: Sep. 28, 2016

(87) PCT Pub. No.: WO2015/151198
PCT Pub. Date: Oct. 8, 2015

(65) Prior Publication Data
US 2017/0176248 A1    Jun. 22, 2017

(51) Int. Cl.
*G01J 1/42* (2006.01)
*G01J 1/16* (2006.01)
(Continued)

(52) U.S. Cl.
CPC .............. *G01J 1/429* (2013.01); *G01J 1/1626* (2013.01); *H01L 27/142* (2013.01);
(Continued)

(58) Field of Classification Search
CPC ...... G01J 1/429; G01J 1/1626; H01L 27/1443; H01L 31/09
(Continued)

(56) References Cited

U.S. PATENT DOCUMENTS 3,911,269 A * 10/1975 Hart .................. H01L 27/00
250/206
5,382,824 A * 1/1995 Popovic .............. H01L 27/1443
257/461
(Continued)

FOREIGN PATENT DOCUMENTS

JP    2004-061417 A    2/2004
JP    2005-175430 A    6/2005
(Continued)

OTHER PUBLICATIONS

Miura et al., "Development of SOI UV Sensor IC," OKI Technical Review, 74: 38-39 (2007).
(Continued)

*Primary Examiner* — David Porta
*Assistant Examiner* — Blake Riddick
(74) *Attorney, Agent, or Firm* — Morgan, Lewis & Bockius LLP (57) ABSTRACT

Provided is a solid-state light-receiving device for ultraviolet light, which is capable of measuring an irradiation amount of UV-rays, which are harmful to a human body, accurately and appropriately with a simple structure, and of being formed easily and integrally with sensors of peripheral circuits, and which is small, lightweight, low cost, and suitable for mobile or wearable applications. The solid-state light-receiving device for ultraviolet light includes a first photodiode, a second photodiode, and a differential circuit to which signals based on outputs of those photodiodes are input. The solid-state light-receiving device for ultraviolet light also includes semiconductor layer regions, which are formed in and on the above-mentioned photodiodes, and each of which includes a highest concentration position of semiconductor impurities.

6 Claims, 11 Drawing Sheets

(51) Int. Cl.
*H01L 27/14* (2006.01)
*H01L 31/09* (2006.01)
*H01L 27/142* (2014.01)
*H01L 27/144* (2006.01)

(52) U.S. Cl.
CPC .......... *H01L 27/1443* (2013.01); *H01L 31/09* (2013.01); *H05K 999/99* (2013.01); *Y02E 10/50* (2013.01)

(58) Field of Classification Search
USPC ........ 250/370.01, 214.1, 338.4, 370.14, 372, 250/370.08
See application file for complete search history.

(56) References Cited

U.S. PATENT DOCUMENTS

| | | | | |
|---|---|---|---|---|
| 5,723,877 | A * | 3/1998 | Sugawa | H01L 27/14609 250/338.4 |
| 2003/0209652 | A1* | 11/2003 | Fujii | H01L 27/14634 250/214.1 |
| 2005/0103983 | A1* | 5/2005 | Yamaguchi | H01L 27/14621 250/214.1 |
| 2009/0179241 | A1* | 7/2009 | Kawai | G01J 1/02 257/292 |
| 2009/0184331 | A1* | 7/2009 | Omi | H01L 27/14621 257/80 |
| 2009/0184387 | A1* | 7/2009 | Takeuchi | H01L 27/14687 257/440 |
| 2009/0243019 | A1* | 10/2009 | Kawai | H01L 27/14609 257/440 |
| 2012/0199826 | A1 | 8/2012 | Nakahara et al. | |
| 2017/0207256 | A1* | 7/2017 | Sugawa | H01L 27/1443 |

FOREIGN PATENT DOCUMENTS

| | | |
|---|---|---|
| JP | 2009/158570 A | 7/2009 |
| JP | 2010-232509 A | 10/2010 |
| JP | 2012-216756 A | 11/2012 |

OTHER PUBLICATIONS

Yamada et al., "A UV Sensor IC based on SOI Technology for UV care application," SICE Annual Conference 2008, Aug. 20-22, 2008, The University Electro-Communications, Japan, pp. 317-320.
International Search Report, issued in International Application No. PCT/JP2014/059553.

* cited by examiner

SOLID LIGHT-RECEIVING DEVICE FOR UV LIGHT

TECHNICAL FIELD

This invention relates to a solid-state light-receiving device for ultraviolet light.

BACKGROUND ART

A threat of ultraviolet rays (UV-rays) accompanying formation and development of the ozone hole, in particular, a fear of skin cancer caused by irradiation with UV-rays is a threat and fear not only to people in the southern hemisphere, in which the development of the ozone hole is significant, but to all mankind, and measures against UV-rays are a big problem.

Meanwhile, brown suntan is still a determinant of health and attractiveness, and young people are often eager to bask in the sun.

Further, in terms of maintaining health, there is a need to acquire vitamin D through exposure to the sunlight.

From the above-mentioned points, it is strongly desired to bask in the sunlight while avoiding UV-rays (UV-A: wavelength of from 315 nm to 380 nm, UV-B: wavelength of from 280 nm to 315 nm, and UV-C: wavelength of from 200 nm to 280 nm or less), which are harmful to a human body.

In daily life, measures to avoid suntan (measures against UV-rays), which are taken in reality, include using goods, such as a hat, long gloves, and a parasol, wearing a long-sleeved shirt or the like, and applying cosmetics or drugs for avoiding suntan to exposed skin.

However, even though an amount of UV-rays in the sunlight is large not only in the heat of midsummer but also in cloudy days, the measures against UV-rays often tend to be neglected in cloudy days. Further, when it suddenly changes to a weather with a large amount of UV-rays while out of the house, the measures against UV-rays often cannot be taken securely.

In view of the above, there have recently been started to be proposed or commercialized a mobile ultraviolet light sensor so as to measure UV-rays and take appropriate measures against UV-rays.

Incidentally, the sunlight includes visible light and infrared light in addition to UV-rays. Therefore, when an irradiation amount of UV-rays is to be measured, a correct irradiation amount of UV-rays cannot be measured unless the influence of rays other than UV-rays on a measured value is avoided.

When bulk silicon (Si) is used as a semiconductor substrate, a silicon (Si) layer is sensitive not only to UV-rays but also to visible light and infrared light. Therefore, for example, an optical filter for cutting visible light and infrared light is necessary, and has caused an increase in cost. As one solution to the problem, there are examples in which a thin-film silicon-on-insulator (SOI) substrate is used (Non Patent Documents 1 and 2).

The UV sensor disclosed in each of Non Patent Documents 1 and 2 is selectively given high sensitivity mainly to light having a wavelength of 400 nm or less utilizing the fact that the SOI layer is thin and relatively easy to transmit visible light and infrared light.

PRIOR ART DOCUMENT(S)

Non Patent Document(s)

Non Patent Document 1: Miura et., al, "Development of SOI UV sensor IC", OKI Technical Review, October 2007, No. 211, Vol. 74 No. 3, pp 38-39

Non Patent Document 2: "A UV Sensor IC based on SOI Technology for UV care application", SICE Annual conference 2008, August 20-22, 2008, The University Electro-Communications, Japan, pp 317-320

SUMMARY OF THE INVENTION

Problem to be Solved by the Invention

However, the UV sensor disclosed in each of Non Patent Documents 1 and 2 still has sensitivity also to light having a wavelength of 380 nm or more (see FIG. 1 of Non Patent Document 1 and FIG. 5 of Non Patent Document 2), and has not sufficiently solved the above-mentioned problem.

As another solution, it may be contemplated to further reduce the thickness of the SOI layer. However, in that case, integral formation with peripheral circuits, which is one of the features, becomes difficult, and hence the reduction in thickness of the SOI layer is not preferred.

This invention has been made through intensive study and research in view of the above-mentioned point, and therefore has a main object to provide a solid-state light-receiving device for ultraviolet light, which is capable of measuring an irradiation amount of UV-rays, which are harmful to a human body, accurately and appropriately with a simple structure, and of being formed easily and integrally with sensors of peripheral circuits.

It is another object of this invention to provide a solid-state light-receiving device for ultraviolet light, which is small, lightweight, low cost, and suitable for mobile or wearable applications.

A first aspect of this invention to provide a solid-state light-receiving device for ultraviolet light comprising a semiconductor substrate having silicon (Si) as a main component, the semiconductor substrate including a first photodiode (1) and a second photodiode (2), which are arranged so as not to three-dimensionally overlap with each other in effect; and a differential circuit to which a signal (1) based on an output (1) from the first photodiode (1) and a signal (2) based on an output (2) from the second photodiode (2) are input, wherein the first photodiode (1) includes a semiconductor layer region (1-1) of a first conductivity type (1), and a semiconductor layer region (1-2) of a second conductivity type (2), which is formed on the semiconductor layer region (1-1) and forms a semiconductor junction with the semiconductor layer region (1-1), the second conductivity type (2) being opposite to the first conductivity type (1), wherein the semiconductor layer region (1-1) has concentrations of semiconductor impurities distributed in a layer thickness direction, and includes a highest concentration position (1-1) in the distribution, wherein the semiconductor substrate further includes a semiconductor layer region (1-3) of the first conductivity type (1) formed on the semiconductor layer region (1-2), the semiconductor layer region (1-3) having concentrations of semiconductor impurities distributed in the layer thickness direction, and including a highest concentration position (1-2) in the distribution, wherein the second photodiode (2) includes a semiconductor layer region (2-1) of the first conductivity type (1), and a semiconductor layer region (2-2) of the second conductivity type (2), which is formed on the semiconductor layer region (2-1) and forms a semiconductor junction with the semiconductor layer region (2-1), the second conductivity type (2) being opposite to the first conductivity type (1), wherein the semiconductor layer region (2-1) has concentrations of semiconductor impurities distributed in the layer thickness direction, and includes a highest concentration position (2-1)

in the distribution, wherein the semiconductor substrate further includes a semiconductor layer region (2-3) of the first conductivity type (1) formed on the semiconductor layer region (2-2), the semiconductor layer region (2-3) having concentrations of semiconductor impurities distributed in the layer thickness direction, and including a highest concentration position (2-2) in the distribution, wherein the highest concentration position (1-1) and the highest concentration position (2-1) are the same or substantially the same in a direction of depth from a front surface of the semiconductor substrate, and wherein the highest concentration position (1-2) and the highest concentration position (2-2) are different in the direction of depth from the front surface of the semiconductor substrate.

A second aspect of this invention is to provide a solid-state light-receiving device for ultraviolet light (UVSD2), wherein the highest concentration position (1-2) is at a position deeper than the highest concentration position (2-2), wherein the semiconductor layer region (1-3) has a layer thickness capable of sufficiently absorbing UV-A light and UV-B light in a region shallower than the highest concentration position (1-2), and wherein the semiconductor layer region (2-3) includes the highest concentration position (2-2) within a thickness at which none of UV-A light and UV-B light is capable of being regarded in effect as being absorbed in the semiconductor layer region (2-3).

A third aspect of this invention to provide a solid-state light-receiving device for ultraviolet light (UVSD3), wherein the differential circuit is formed integrally with the first photodiode (1) and the second photodiode (2) in the semiconductor substrate.

A forth aspect of this invention to provide a solid-state light-receiving device for ultraviolet light (UVSD4), wherein the differential circuit comprises a differential amplifier circuit.

A fifth aspect of this invention is to provide an electronic device comprising the solid-state light-receiving device for ultraviolet light of any one of above mentioned.

A sixth aspect of this invention is to provide the electronic device, wherein the electronic device further has a communication function.

Effect of the Invention

According to this invention, it is possible to measure an irradiation amount of UV-rays, which are harmful to a human body, accurately and appropriately with the simple structure.

Further, according to this invention, the solid-state light-receiving device for ultraviolet light, which is small, light-weight, low cost, and suitable for mobile or wearable applications can be provided.

Further, the peripheral circuits and the sensors can be formed easily and integrally in the semiconductor substrate.

BRIEF DESCRIPTION OF THE DRAWING

FIG. 2 is a graph for showing a profile of concentrations of semiconductor impurities of a photodiode (1) 102a.

MODE FOR EMBODYING THE INVENTION

Figure 1:
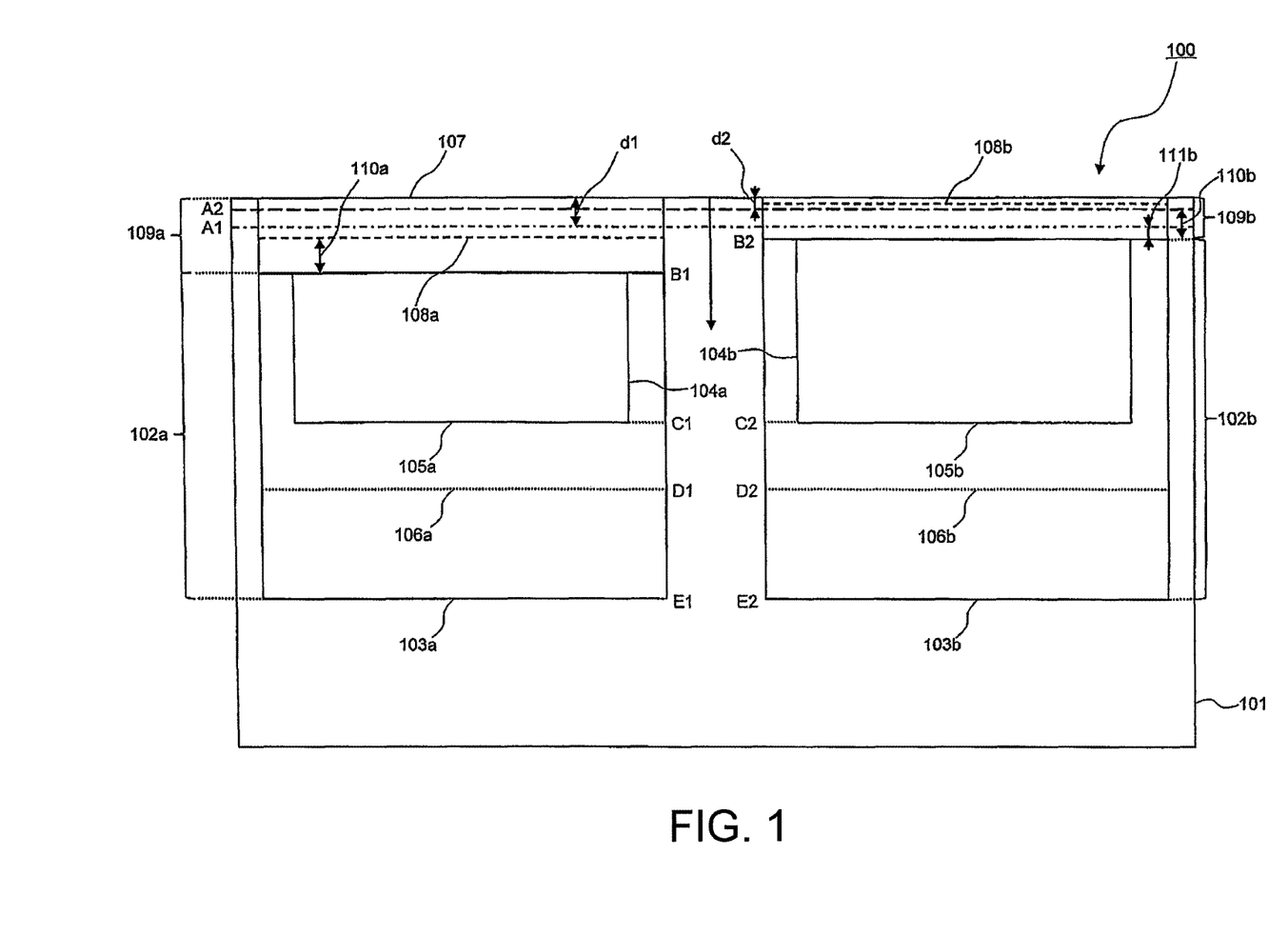
FIG. 1 is a schematic explanatory view for illustrating the structure of a main part of a solid-state light-receiving device for ultraviolet light according to this invention.

FIG. 1 is an example of a schematic explanatory view for illustrating the structure of a solid-state light-receiving device for ultraviolet light according to this invention.

A main part 100 of the solid-state light-receiving device for ultraviolet light illustrated in FIG. 1 includes a first photodiode (1) 102a and a second photodiode (2) 102b in a semiconductor substrate 101, which has silicon (Si) as a main component.

The first photodiode (1) 102a and the second photodiode (2) 102b are arranged in the semiconductor substrate 101 so as not to three-dimensionally overlap with each other in effect.

The phrase "so as not to three-dimensionally overlap with each other in effect" as used herein means that incident surfaces of the first photodiode (1) 102a and the second photodiode (2) 102b do not overlap or do not substantially overlap with each other in a direction perpendicular to the incident surfaces. In other words, the phrase means that each of outputs of the respective photodiodes when irradiated with light is input to the differential circuit, and a signal output as a differential signal from the differential circuit is within an allowable range in which the signal is capable of being regarded as being generated only from UV-rays of interest.

In the main part 100 of the solid-state light-receiving device for ultraviolet light illustrated in FIG. 1, the first photodiode (1) 102a has the structure of the main part 100 of the light-receiving device to be described below so that a value of a factor based on UV-rays, such as UV-A and UV-B, in the output signal is zero ("0") or as close to "0" as possible.

In other words, the output signal of the photodiode (1) 102a when irradiated with sunlight is based on light having a wavelength that is longer than that of UV-A.

Meanwhile, the second photodiode (2) 102b has the structure of the main part 100 of the light-receiving device to be described below so that UV-rays, such as UV-A and UV-B, as well as light in a range of visible light and a range of a wavelength that is longer than that of visible light also contribute to the output signal.

With the first photodiode (1) 102a and the second photodiode (2) 102b having the above-mentioned structure, a difference between the output signal of the first photodiode (1) 102a and the output signal of the second photodiode (2) 102b may be taken to appropriately and effectively extract an output signal generated from UV-rays, such as UV-A and UV-B.

The first photodiode (1) 102a includes a semiconductor layer region (1-1) 103a of a first conductivity type (1), and a semiconductor layer region (1-2) 104a of a second conductivity type (2), which is formed on the semiconductor layer region (1-1) 103a and forms a semiconductor junction 105a with the semiconductor layer region (1-1) 103a, the second conductivity type (2) being opposite to the above-mentioned conductivity type (1).

The second photodiode (2) 102b includes a semiconductor layer region (2-1) 103b of the first conductivity type (1), and a semiconductor layer region (2-2) 104b of the second conductivity type (2), which is formed on the semiconductor layer region (2-1) 103b and forms a semiconductor junction 105b with the semiconductor layer region (2-1) 103b, the second conductivity type (2) being opposite to the above-mentioned conductivity type (1).

The photodiode in this invention is a photodiode with a structure having a semiconductor junction formed by bringing two semiconductor layer regions of different polarities into direct contact with each other as described above. In a layer region including the semiconductor junction, there is formed a depletion layer having such a width that sufficient photocurrent is generated. The number of semiconductor junctions is not limited to one, and a plurality of semiconductor junctions may be provided.

The semiconductor layer region (1-1) 103a contains semiconductor impurities (1) providing the first conductivity type (1). Concentrations of the semiconductor impurities (1) are distributed in a layer thickness direction of the above-mentioned semiconductor layer region (1-1) 103a. In the distribution, the highest concentration position (1-1) 106a is provided in the layer thickness direction.

The semiconductor layer region (2-1) 103b contains semiconductor impurities (2) providing the second conductivity type (2). Concentrations of the semiconductor impurities (2) are distributed in a layer thickness direction of the above-mentioned semiconductor layer region (2-1) 103b. In the distribution, the highest concentration position (2-1) 106b is provided in the layer thickness direction.

In FIG. 1, the highest concentration position (1-1) 106a and the highest concentration position (2-1) 106b are the same or substantially the same in a direction of depth from a position of a front surface 107 of the semiconductor substrate 101. However, in order to measure the harmful UV-rays more accurately, it is preferred that the highest concentration position (1-1) 106a and the highest concentration position (2-1) 106b be intentionally designed at different positions for design flexibility.

The phrase "substantially the same" as used herein means that there may be obtained substantially the same effects as the effects obtained when the highest concentration position (1-1) 106a and the highest concentration position (2-1) 106b are the same in the direction of depth from the front surface 107 of the semiconductor substrate 101.

A semiconductor layer region (1-3) 109a of the conductivity type (1) is formed on the semiconductor layer region (1-2) 104a, and the semiconductor layer region (1-3) 109a has concentrations of semiconductor impurities distributed in the layer thickness direction, and includes the highest concentration position (1-2) 108a in the distribution.

A semiconductor layer region (2-3) 109b of the conductivity type (2) is formed on the semiconductor layer region (2-2) 104b, and the semiconductor layer region (2-3) 109b has concentrations of semiconductor impurities distributed in the layer thickness direction, and includes the highest concentration position (2-2) 108b in the distribution.

The highest concentration position (1-2) 108a and the highest concentration position (2-2) 108b are different in the direction of depth from the position of the front surface 107 of the semiconductor substrate 101.

In the main part 100 of the light-receiving device illustrated in FIG. 1, the highest concentration position (1-2) 108a is at a position deeper than the highest concentration position (2-2) 108b.

The semiconductor layer region (1-3) 109a has a layer thickness d1 capable of sufficiently absorbing UV-A light and UV-B light in a region shallower than the highest concentration position (1-2) 108a (thickness from the position of the front surface 107 of the semiconductor substrate to a position A1 in the thickness direction).

In this invention, there is no problem in design when the position A1 is the same position as the highest concentration position (1-2) 108a, but as long as the layer thickness d1 capable of sufficiently absorbing UV-A light and UV-B light is secured, it is preferred that the position A1 be located above the highest concentration position (1-2) 108a as a manufacturing tolerance.

A layer thickness of a layer region (A1) 110a, which is formed between the highest concentration position (1-2) 108a and a position B1, may be determined as appropriate in accordance with a desired design as long as the highest concentration position (1-2) 108a is capable of being provided at an appropriate position.

The semiconductor layer region (2-3) 109b has the highest concentration position (2-2) 108b thereabove in a layer region (B2) 111b having a thickness d2 at which none of UV-A light and UV-B light is capable of being regarded in effect as being absorbed (thickness from the position of the front surface 107 of the semiconductor substrate to a position A2 in the thickness direction).

The thickness d2 may be reduced as much as possible in a range in which the highest concentration position (2-2) 108b may be formed to substantially eliminate the absorption of UV-A light and UVB light in the layer region (B2) 111b having the thickness d2. In other words, the influence of irradiation with UV-A and UV-B in the layer region (B2) 111b may be eliminated or suppressed to a negligible level.

It is desired that the layer thickness of the layer region (B2) 111b be determined as appropriate in accordance with design requirements so as to satisfy the above-mentioned condition. Specifically, it is desired that the layer thickness be preferably 6 nm or less, and more preferably 2 nm or less.

In FIG. 1, there is illustrated an example in which the highest concentration position (2-2) 108b is formed inside the layer region (B2) 111b, but the highest concentration position (2-2) 108b may be formed at a position at the same level as the front surface 107.

In this invention, the layer region (A2) 110b between the position A2 and the position B2 is not necessarily formed, and may be omitted in design depending on characteristics and performance of the light-receiving device.

With the semiconductor layer region (2-3) 109b having the above-mentioned structure, the influence of irradiation with UV-A and UVB on the output of the photodiode (1) 102a when irradiated with sunlight may be effectively eliminated.

In regard to the photodiode (1) 102a and the photodiode (2) 102b, it is desired that the positions C1 and C2, the positions D1 and D2, and the positions E1 and E2 be located at equal or substantially equal positions.

With the respective positions having the positional relationship as described above, the amounts and intensities of UV-A light and UV-B light may be measured more appropriately.

In this invention, for the purpose of mechanical protection, a passivation film (or protective film) may be formed of an insulating material, such as $SiO_2$, SiN, or SiCN, to have a predetermined thickness on the front surface 107 at least in parts immediately above the photodiode (1) 102a and the photodiode (2) 102b.

In the case of this invention, the main part 100 of the light-receiving device is configured as described above so that a film thickness of the passivation film may be selected arbitrarily without considering the influence of interference with the film thickness.

Figure 2:
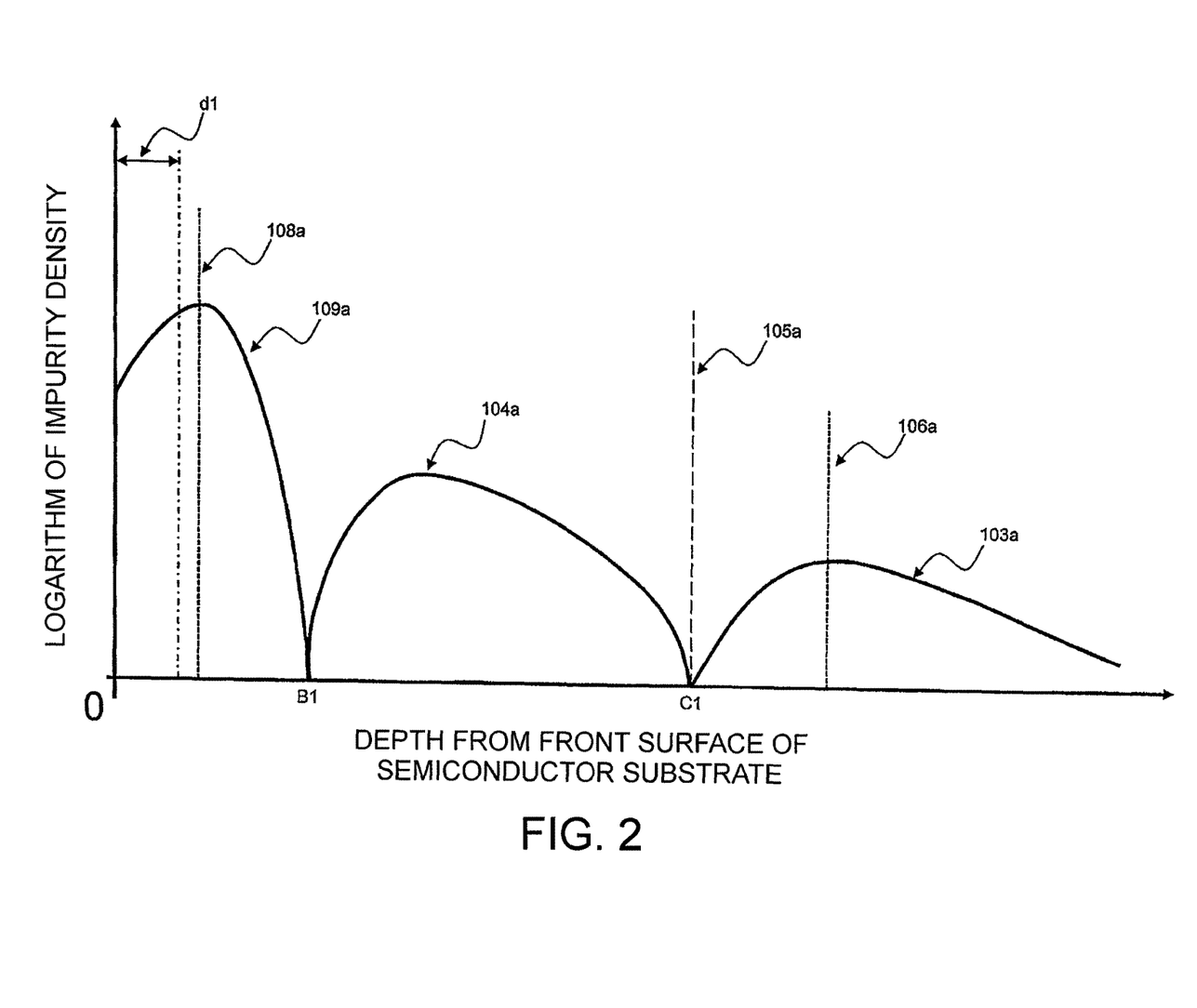

In FIG. 2, there is shown a profile of concentrations of semiconductor impurities of the photodiode (1) 102a.

In FIG. 2, the horizontal axis indicates the depth from the front surface 107 of the semiconductor substrate 101, and the vertical axis indicates a concentration value (A) of the semiconductor impurities in logarithm.

In the layer region in which the semiconductor impurities for the first conductivity type (1) and the second conductivity type (2) are mixed, the concentration value (A) of the semiconductor impurities is expressed as an absolute value of a difference between the concentration value of the semiconductor impurities of the first conductivity type (1) and the concentration value of the semiconductor impurities of the second conductivity type (2).

In the following, the same is true for a description of a similar profile.

Figure 3:
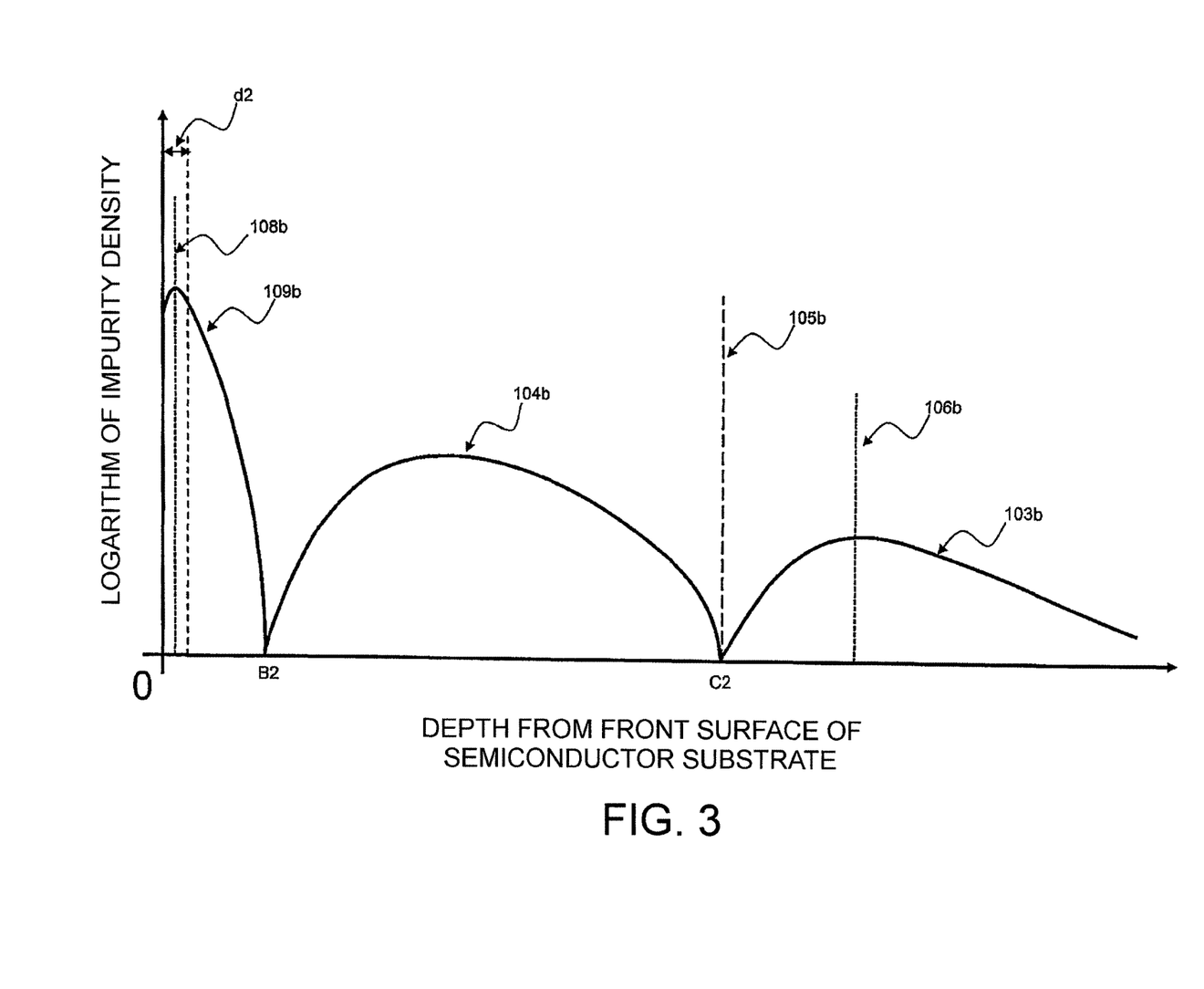
FIG. 3 is a graph for showing a profile of concentrations of semiconductor impurities of a photodiode (2) 102b.

Similarly, in FIG. 3, there is shown a profile of concentrations of semiconductor impurities of the photodiode (2) 102b. The horizontal axis and the vertical axis in FIG. 3 are the same as those in FIG. 2.

Figure 4:
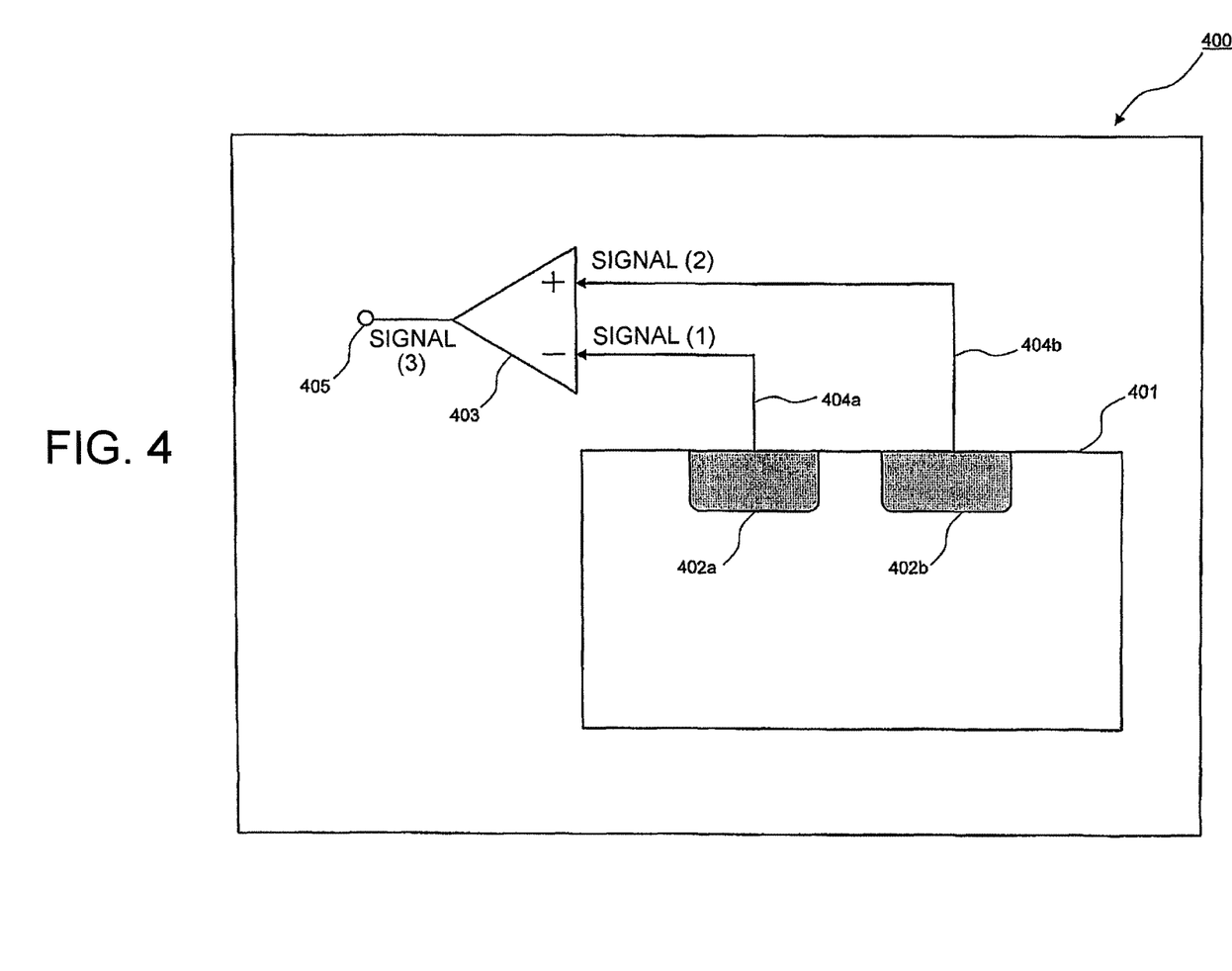
FIG. 4 is a schematic view for schematically illustrating the basic structure of the solid-state light-receiving device for ultraviolet light according to this invention.

In FIG. 4, the basic structure of the solid-state light-receiving device for ultraviolet light according to this invention is schematically illustrated.

A solid-state light-receiving device for ultraviolet light 400 includes a photodiode (1) 402a, a photodiode (2) 402b, and a differential circuit 403, which are formed in a semiconductor substrate 401, which has silicon (Si) as a main component.

In FIG. 4, a signal (1) based on output from the photodiode (1) 402a is input to a negative terminal of the differential circuit 403 through a line 404a, and a signal (2) based on output from the photodiode (2) 402b is input to a positive terminal of the differential circuit 403 through a line 404b.

When the signal (1) and the signal (2) are input to the differential circuit 403, a differential signal (3) is output from an output terminal 405.

The differential circuit 403 may have an amplification function or no amplification function as long as the differential circuit 403 has a differential function, but it is desired that the differential circuit 403 preferably have an amplification function.

Moreover, the differential circuit 403 may be formed integrally with the photodiodes in the semiconductor substrate 401. Alternatively, the differential circuit 403 may be formed in another semiconductor substrate, and may be mounted on a third substrate together with the semiconductor substrate 401 in which the photodiodes are formed.

Figure 5:
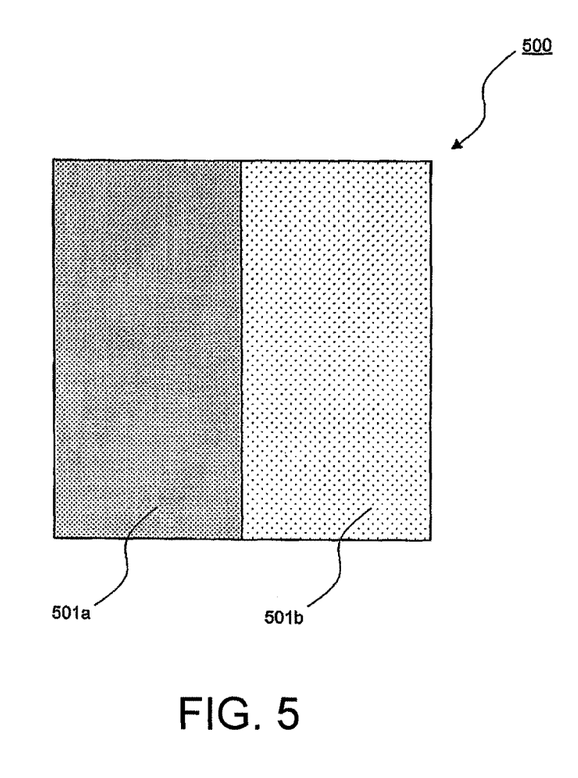
FIG. 5 is a top view for schematically illustrating an example of an arrangement of light incident surfaces of a main part 500 of the solid-state light-receiving device for ultraviolet light according to this invention.

FIG. 5 is a top view for schematically illustrating an example of an arrangement of light incident surfaces of a main part 500 of the solid-state light-receiving device for ultraviolet light according to this invention.

In FIG. 5, there is illustrated an example of the simplest structure of a one-pair photodiode type in which one photodiode (1) 501a and one photodiode (2) 501b are arranged side by side in a plane.

Figure 6:
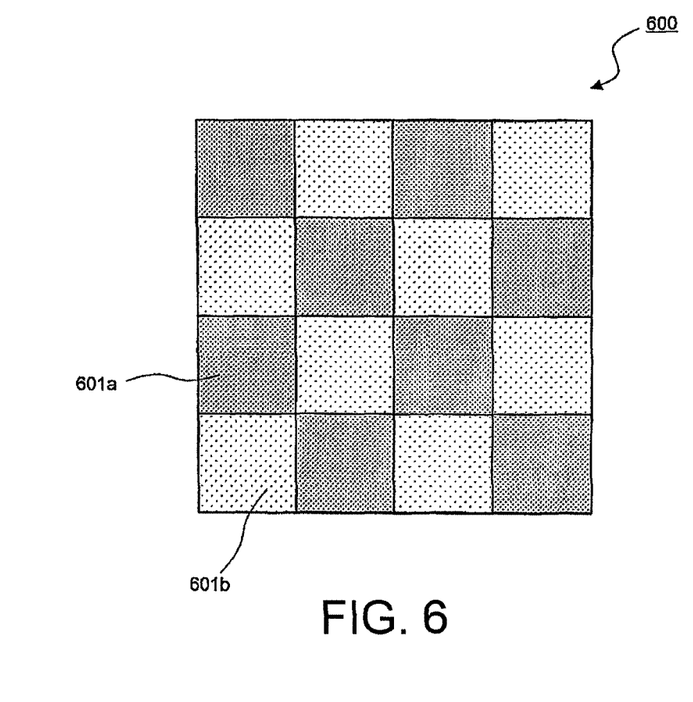
FIG. 6 is a top view for schematically illustrating an example of an arrangement of light incident surfaces of a main part 600 of the solid-state light-receiving device for ultraviolet light according to this invention.

FIG. 6 is a top view for schematically illustrating another example of an arrangement of light incident surfaces of a main part 600 of the solid-state light-receiving device for ultraviolet light according to this invention.

In FIG. 6, there is illustrated an example in which light incident surfaces of eight photodiodes (1) 601a and eight photodiodes (2) 601b are arranged in a checkerboard pattern.

In this manner, the same number of photodiodes (1) and photodiodes (2) according to this invention may be arranged to reduce an individual manufacturing difference among the photodiodes.

Now, one embodiment of a preferred application example of the solid-state light-receiving device for ultraviolet light according to this invention is described.

Figure 7A:
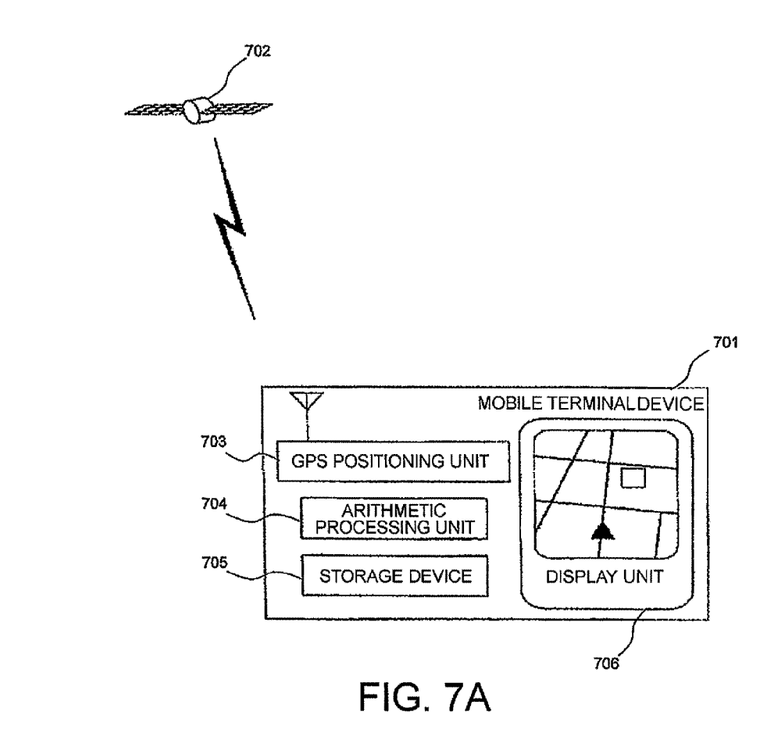
FIG. 7A is a schematic outer appearance for illustrating one embodiment of a case where this invention is applied to a mobile terminal device.
Figure 7B:
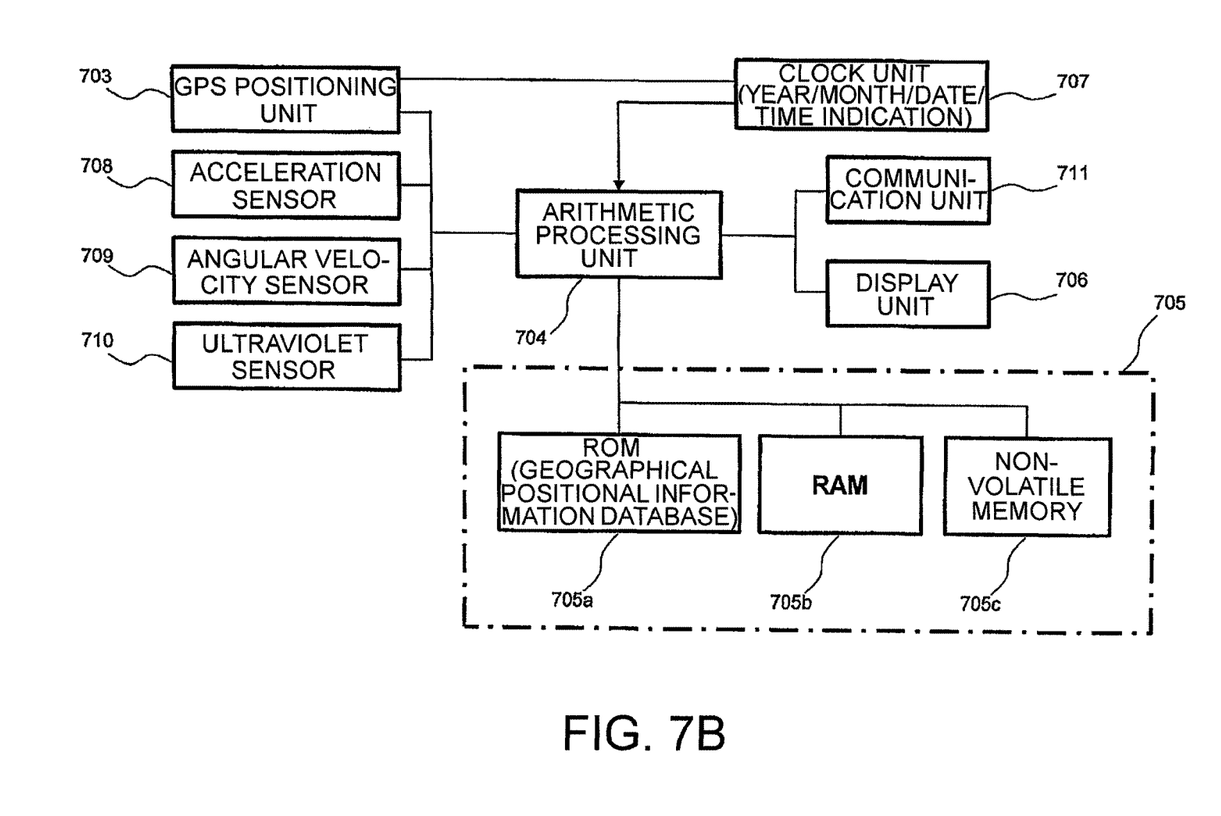
FIG. 7B is a block diagram for illustrating an internal configuration of the mobile terminal device illustrated in FIG. 7A.

FIG. 7A and FIG. 7B are schematic structural diagrams for illustrating one embodiment of a case where this invention is applied to a mobile terminal device.

FIG. 7A is a schematic outer appearance, and FIG. 7B is a block diagram of an internal configuration.

A mobile terminal device 701 illustrated in FIG. 7A and FIG. 7B includes a global positioning system (GPS) positioning unit 703, an arithmetic processing unit 70 4, a storage device 705, and a display unit 706.

Examples of the mobile terminal device 701 include mobile electronic devices, such as a mobile phone device, a personal digital assistant (PDA), a tablet, and a mobile personal computer (PC), or a wrist watch having a navigation function, and wearables, such as a scouter (head-mounted display), a necklace, and a ring, which have an electronic device function.

The GPS positioning unit 703 is configured to function as a first current position calculation unit, which is configured to receive a positional information signal, which is transmitted from a satellite 702, to measure the current position.

The arithmetic processing unit 704 is configured to receive as inputs detection signals from a vertical acceleration sensor 708, which is configured to detect the number of steps, and an angular velocity sensor 709, which is configured to detect an azimuth, and to autonomously measure the current position based on the detection signals, to thereby execute navigation processing.

The arithmetic processing unit 704 is formed of a microcomputer, a central processing unit (CPU), or the like.

The storage device 705 is formed of a read-only memory (ROM) 705a, which is configured to store processing programs to be executed in the arithmetic processing unit 704, and to store storage tables required in arithmetic processing, a random access memory (RAM) 705b, which is configured to store calculation results and the like, which are required in the course of the arithmetic processing, and a non-volatile memory 705c, which is configured to store current position information at the end of the navigation processing.

The display unit 706 is configured to display information on navigation images output from the arithmetic processing unit 704, and is formed of a liquid crystal display, an organic electroluminescence (EL) display, or the like.

A dock unit 707 is configured to display year/month/date/time corrected with current time information indicating year/month/date/time output from the GPS positioning unit 703 when the GPS positioning unit 703 is activated.

The arithmetic processing unit 704 is configured to receive as inputs the current position information output from the GPS positioning unit 703, current time information indicating year/month/date/time output from the clock unit 707, acceleration information output from the acceleration sensor 708, which is worn at a waist position of a user holding the mobile terminal device 701, angular velocity information corresponding to an azimuth of a direction in which the user is walking, which is output from the angular velocity sensor 709, such as a gyroscope equipped to the mobile terminal device 701, and ultraviolet light intensity information output from an ultraviolet sensor (solid-state light-receiving device for ultraviolet light) 710 serving as ultraviolet light detecting means for measuring an intensity of UV-rays irradiated on the mobile terminal device 701.

A communication unit 711 configured to wirelessly communicate with an external wireless communication device is connected to the arithmetic processing unit 704.

The ROM 705*a* is configured to store a geographical positional information storage table, and a UV index threshold storage table in which a threshold of a UV index indicating an ultraviolet light intensity in correspondence with months of the year is set for each geographic area.

In addition, the ROM 705*a* is configured to store a day/night determination processing program, which is configured to calculate sunrise and sunset times that indicate the boundary between day and night and are used as references for determining whether or not the ultraviolet light intensity detected by the ultraviolet sensor 710 is valid, a UV index threshold calculation program, which is configured to calculate a UV index threshold THuv to be similarly used as a reference for determining whether or not the ultraviolet light intensity is valid, an autonomous positioning calculation program configured to perform autonomous positioning calculation, and a calculation unit selection processing program configured to select one of the current position information calculated by the GPS positioning unit 703 and the current position information calculated by the autonomous positioning calculation processing performed by the autonomous positioning program.

In the geographical positional information storage table, names of prefectures across the country, names of capitals of the respective prefectures, and latitudes (N) and longitudes (E) of the capitals are listed.

In the UV index threshold storage table, UV index thresholds THuv are set for each period obtained by dividing the year into periods of three months: January to April, May to August, and September to December for each geographic area obtained by dividing the Japanese archipelago into four, that is, Sapporo, Tsukuba, Kagoshima, and Naha.

In May to August, the UV index threshold THuv is a fixed value irrespective of the latitude, but in January to April and September to December, the UV index threshold THuv is set to become smaller as the latitude becomes higher.

Moreover, the arithmetic processing unit 704 is configured to execute day/night determination processing and the UV index threshold calculation processing, which serve as references for determining whether or not the ultraviolet light intensity is valid in accordance with the day/night determination processing program.

In the UV index threshold calculation processing, it is first determined whether or not the current position information is generated by the GPS positioning unit 703. When the current position information is generated by the GPS positioning unit 703, the current position information calculated by the GPS positioning unit 703 is read, and it is determined which of the four divided areas: Sapporo, Tsukuba, Kagoshima, and Naha belongs to the geographic area to which the current position belongs.

Next, month information is read from the clock unit 707, and the UV index threshold storage table is referenced based on the determined one of the four divided areas and the month information to calculate the UV index threshold THuv. Then, the UV index threshold calculation processing is ended.

Further, the arithmetic processing unit 704 is configured to execute the autonomous positioning calculation processing in accordance with the autonomous positioning calculation program, which is configured to perform the autonomous positioning calculation.

The autonomous positioning calculation processing is activated when the autonomous calculation processing is selected by calculation unit selection processing. In an initial state, the current position measured last time by the GPS positioning unit 703 is set as an initial position, and then the autonomous positioning calculation processing is executed as timer interrupt processing for every predetermined time period (for example, 10 msec) with respect to a predetermined main program. In other words, an angular velocity θv detected by the angular velocity sensor 709 is first read. Next, the angular velocity θv is integrated to calculate an azimuth θ, and then the processing proceeds to the next step.

Next, a vertical acceleration G detected by the acceleration sensor 708 is read, and the number of steps P is calculated based on a pattern in which the vertical acceleration G is changed. The calculated number of steps P is multiplied by a preset step length W to calculate a travel distance L, and the current position information is updated based on the calculated azimuth θ and the travel distance L. The updated current position information is displayed on the display unit 706 while being superimposed on map information, and then the timer interrupt processing is ended to return to the predetermined main program.

Furthermore, the arithmetic processing unit 704 is configured to execute the calculation unit selection processing in which one of the current position information measured by the GPS positioning unit 703 and the current position information measured by the autonomous positioning calculation processing is selected in accordance with the calculation unit selection processing program.

The calculation unit selection processing is started to be executed when the mobile terminal device 701 is powered on and when navigation processing is selected. The calculation unit selection processing is executed to select one of the current position information measured by the GPS positioning unit 703 and the current position information measured by the autonomous positioning calculation processing.

Having small and lightweight properties, the solid-state light-receiving device for ultraviolet light according to this invention may be easily mounted in the mobile terminal device listed above, as well as in a compact being a cosmetic tool, a mobile navigation device, a driving recorder, a mobile barometer/level meter for climbing, a stop watch, or the like.

"Embodiment mode of manufacturing main part of solid-state light-receiving device for ultraviolet light"

Next, there is described a preferred example of manufacturing a main part of a light-receiving device including a p+np type element structure.

It should be understood in the technical field of this invention that this invention also encompasses a case where polarities of the element structure are opposite.

The light-receiving device according to this invention may be formed using a general semiconductor manufacturing technology. Therefore, in the following description of steps, points apparent to a person having ordinary skill in the art are omitted, and essential points are described briefly.

(1) An Si wafer (semiconductor substrate) is prepared. Here, a p-type Si wafer having a concentration of p-type impurities of $1\times10^{16}$ cm$^{-3}$ is prepared.

It should be understood that an n-type Si wafer having a concentration of n-type impurities of $1\times10^{16}$ cm$^{-3}$ may be used instead.

(2) A 7-nm SiO$_2$ film is formed on the semiconductor substrate (p-type Si wafer). Here, water oxidation at 750° C. is performed.

(3) Ion implantation for forming p-type wells to serve as the semiconductor layer regions (1-1) and (2-1) is performed.

Here, in obtaining a difference between the output of the first photodiode (1) and the output of the second photodiode (2), it is preferred to form the p-type wells so as to provide a difference between the highest concentration position (1-1) and the highest concentration position (2-1), to thereby make output resulting from sunlight having a wavelength that is longer than 380 nm substantially zero (0).

In order to form the highest concentration position (1-1) at 565 nm, the following ion implantation conditions for forming p-type wells of the first photodiode (1) are used: ion species of B$^+$, implantation energy of 180 keV, and a dose of $1.0\times10^{13}$ cm$^{-2}$.

In order to form the highest concentration position (1-2) at 500 nm, the following ion implantation conditions for forming p-type wells of the second photodiode (2) are used: ion species of B$^+$, implantation energy of 150 keV, and a dose of $1.0\times10^{13}$ cm$^{-2}$.

(4) In order to activate impurity atoms implanted in Step (3), heat treatment is performed.

Here, heat treatment is performed at 900° C. for 30 minutes in a nitrogen atmosphere.

(5) Ion implantation for forming the semiconductor layer regions (1-2) and (2-2) is performed.

Here, the semiconductor layer regions (1-2) and (2-2) are formed at the same time.

The ion implantation conditions may be adjusted separately.

In order to form the semiconductor junction at a position of about 300 nm, the following ion implantation conditions are used: ion species of P$^+$, implantation energy of 120 keV, and a dose of $1.5\times10^{13}$ cm$^{-2}$.

(6) Ion implantation for forming the semiconductor layer region (1-3) of the first photodiode (1) is performed.

In order to form the highest concentration position (1-2) at about 30 nm, the following conditions are used: ion species of BF$^{2+}$, implantation energy of 45 keV. and a dose of $1.2\times10^{13}$ cm$^{-2}$.

(7) Ion implantation for forming the semiconductor layer region (2-3) of the second photodiode (2) is performed.

In order to form the highest concentration position (2-2) at about 1 nm, the following conditions are used: ion species of BF$^{2+}$, implantation energy of 15 keV, and a dose of $1.0\times10^{13}$ cm$^{-2}$.

(8) In order to extract photocharges from the semiconductor layer regions (1-2) and (2-2), ion implantation is performed to form a high-concentration n-type impurity layer in a partial region of each of the semiconductor layer region (1-2) and the semiconductor layer region (2-2).

The following conditions are used: ion species of implantation energy of 40 keV, and a dose of $5\times10^{15}$ cm$^{-2}$.

(9) In order to extract photocharges from the semiconductor layer regions (1-1) and (2-1), ion implantation is performed to form a high-concentration p-type impurity layer in a partial region of each of the semiconductor layer region (1-1) and the semiconductor layer region (2-1).

The following conditions are used: ion species of BF$^{2+}$, implantation energy of 40 keV, and a dose of $5\times10^{15}$ cm$^{-2}$.

(10) In order to activate the implanted impurity atoms, heat treatment is performed.

Here, heat treatment is performed at 1,000° C. for 5 seconds in a nitrogen atmosphere.

(11) A wiring interlayer insulation film is formed. Here, a 300-nm SiO$_2$ film is formed using chemical vapor deposition.

(12) In order to connect the high-concentration n-type impurity layer, the high-concentration p-type impurity layer, and wiring lines to one another, contact holes are formed. Here, the wiring interlayer insulation film is etched by dry etching.

(13) In order to form Al wiring lines, a 500-nm Al film is formed using a sputtering method.

(14) In order to form the Al wiring lines, a partial region of Al is etched and patterned by dry etching.

(15) In order to form the passivation film, a 300-nm SiN film is formed using chemical vapor deposition.

In order for UV-rays to be transmitted satisfactorily, it is preferred to adjust film forming conditions so that a content of hydrogen is low.

(16) The passivation film formed on pad regions for outputting signals is removed. Here, the SiN film is etched by dry etching.

(17) In order to perform hydrogen sintering, heat treatment is performed at 400° C. in a nitrogen atmosphere containing 10% of hydrogen.

As an example of the solid-state light-receiving device for ultraviolet light according to this invention produced as described above, it was found that cumulative relative light-receiving sensitivity for light having a wavelength of 380 nm or more was able to be suppressed to several percent or less of cumulative relative light sensitivity for light over the entire wavelength, and hence harmful UV-rays were able to be measured accurately. The results are described with reference to FIG. 8 to FIG. 10.

Figure 8:
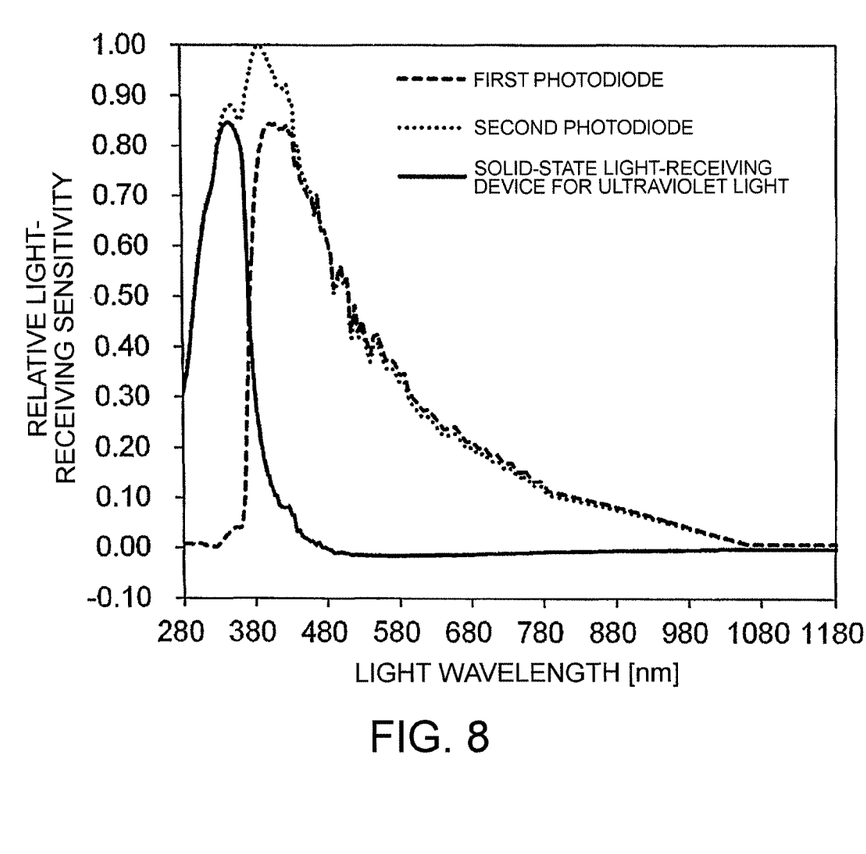
FIG. 8 is a graph for showing relative light-receiving sensitivity of the photodiode (1), the photodiode (2), and the light-receiving device according to this invention, in which the photodiodes are formed.

FIG. 8 is a graph for showing relative light-receiving sensitivity of the first photodiode (1), the second photodiode (2), and the light-receiving device according to this invention, in which the photodiodes are formed.

Figure 9:
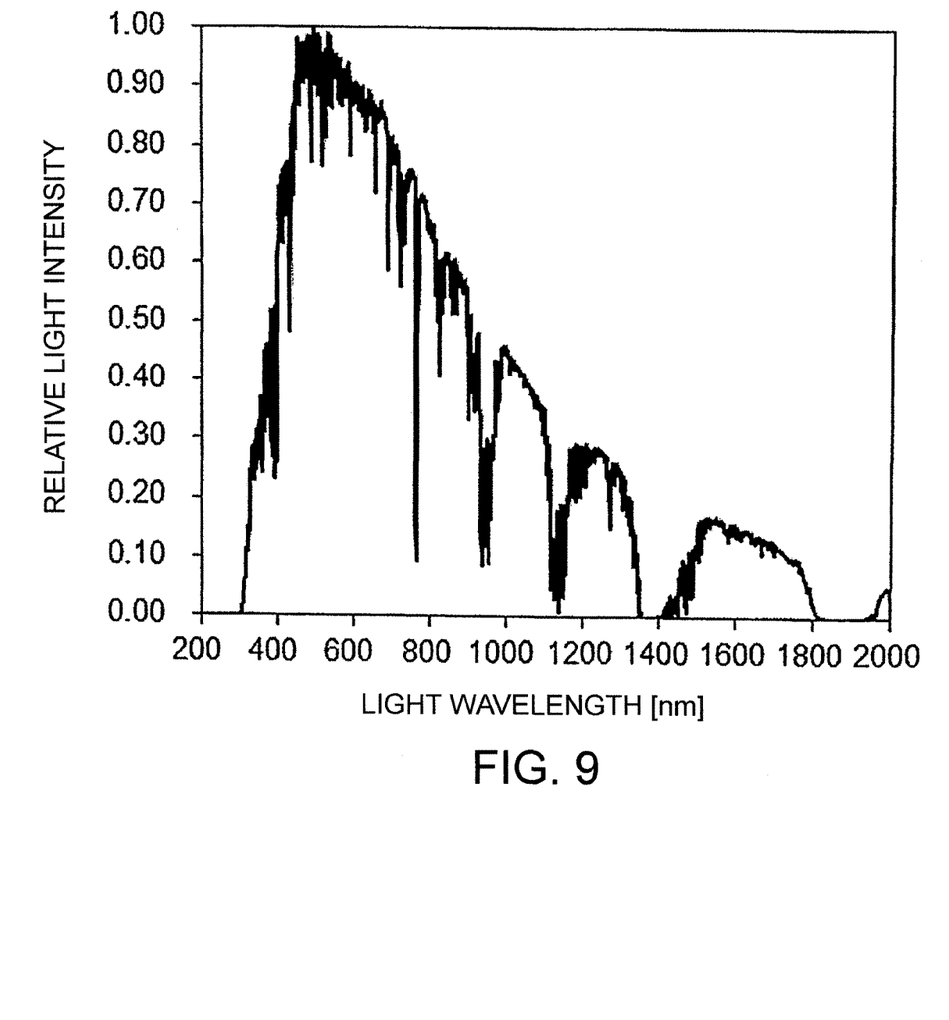
FIG. 9 is a graph for showing a spectrum of sunlight that shines on the Earth's surface.

FIG. 9 is a graph for showing a spectrum unlight that shines on the Earth's surface.

Figure 10:
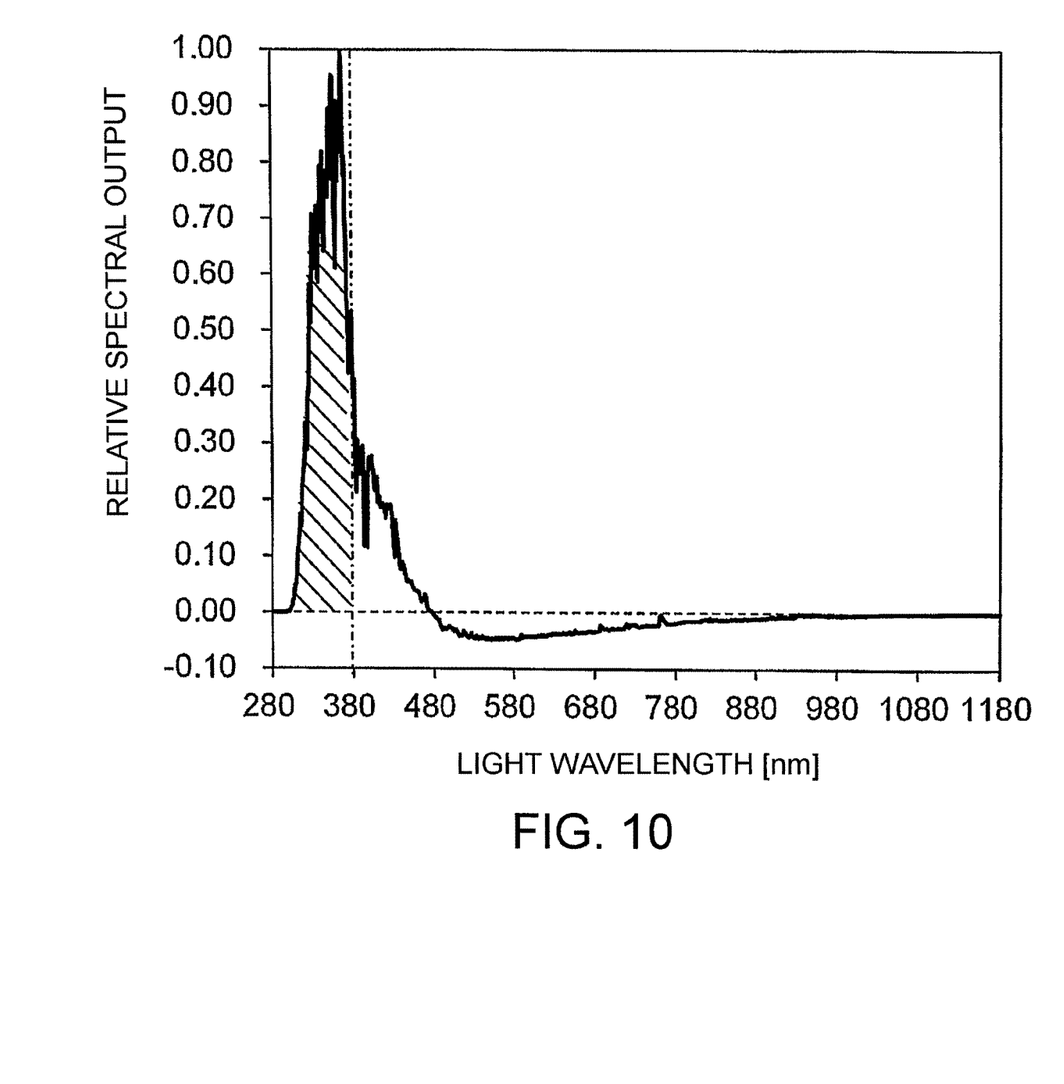
FIG. 10 is a graph for showing relative spectral output of the light-receiving device according to this invention taking FIG. 9 into consideration.

FIG. 10 is a graph for showing relative spectral output of the light-receiving device according to this invention taking FIG. 9 into consideration.

(A) First photodiode (1)
Highest concentration position (1-1)=565 nm
Highest concentration position (1-2)=30 nm
(B) Second photodiode (2)
Highest concentration position (2-1)=500 nm
Highest concentration position (2-2)=1 nm As apparent from FIG. 10, a proportion of the output (diagonally shaded portion) of light wavelength: 280 nm to 380 nm to an integral value of the output corresponding to the entire light wavelength was 96%.

REFERENCE SIGNS LIST 100, 500, 600 . . . main part of solid-state light-receiving device for ultraviolet light 101 . . . semiconductor substrate
102a, 501a, 601a . . . photodiode (1)
102b, 501b, 601b . . . photodiode (2)
103a . . . semiconductor layer region (1-1)
103b . . . semiconductor layer region (2-1)
104a . . . semiconductor layer region (1-2)
104b . . . semiconductor layer region (2-2)
105a . . . semiconductor junction (1)
105b . . . semiconductor junction (2)
106a . . . highest concentration position (1-1)
106b . . . highest concentration position (2-1)
107 . . . front surface
108a . . . highest concentration position (1-2)
108b . . . highest concentration position (2-2)
109a . . . semiconductor layer region (1-3)
109b . . . semiconductor layer region (2-3)
110a . . . layer region (A1)
110b . . . layer region (A2)
111b . . . layer region (B2)
400 . . . solid-state light-receiving device for ultraviolet light
401 . . . semiconductor substrate
402a . . . photodiode (1)
402b . . . photodiode (2)
403 . . . differential circuit
404a, 404b . . . line
405 . . . output terminal

The invention claimed is:

1. A solid-state light-receiving device for ultraviolet light, comprising:
a semiconductor substrate having silicon (Si) as a main component, the semiconductor substrate including a first photodiode and a second photodiode, both of which are arranged so as not to three-dimensionally overlap with each other in effect; and
a differential circuit to which a first signal based on a first output from the first photodiode and a second signal based on a second output from the second photodiode are input,
(a) wherein the first photodiode includes a first semiconductor layer region of a first conductivity type, and a second semiconductor layer region of a second conductivity type, which is formed on the first semiconductor layer region and forms a semiconductor junction with the first semiconductor layer region, the second conductivity type being opposite to the first conductivity type,
(b) wherein the first semiconductor layer region has first concentrations of semiconductor impurities distributed in a layer thickness direction, and includes a highest concentration first position in the first distribution,
(c) wherein the second photodiode includes a third semiconductor layer region of the first conductivity type, and a fourth semiconductor layer region of the second conductivity type, which is formed on the third semiconductor layer region and forms a semiconductor junction with the third semiconductor layer region, the second conductivity type being opposite to the first conductivity type,
(d) wherein the third semiconductor layer region has second concentrations of semiconductor impurities distributed in the layer thickness direction, and includes a highest concentration second position in the second distribution,
(e) wherein the semiconductor substrate further includes a fifth semiconductor layer region of the first conductivity type formed on the second semiconductor layer region, the fifth semiconductor layer region having third concentrations of semiconductor impurities distributed in the layer thickness direction, and including a highest concentration third position in the third distribution,
(f) wherein the semiconductor substrate further includes a sixth semiconductor layer region of the first conductivity type formed on the fourth semiconductor layer region, the sixth semiconductor layer region having fourth concentrations of semiconductor impurities distributed in the layer thickness direction, and including a highest concentration fourth position in the fourth distribution,
(g) wherein the highest concentration first position and the highest concentration second position are the same in a direction of depth from a front surface of the semiconductor substrate, and
(h) wherein the highest concentration third position and the highest concentration fourth position are different in the direction of depth from the front surface of the semiconductor substrate.

2. The solid-state light-receiving device for ultraviolet light according to claim 1,
wherein the second highest concentration position is at a position deeper than the fourth highest concentration position,
wherein the third semiconductor layer region has a layer thickness capable of sufficiently absorbing UV-A light and UV-B light in a region shallower than the second highest concentration position, and
wherein the sixth semiconductor layer region includes the fourth highest concentration position within a thickness at which none of UV-A light and UV-B light is capable of being regarded in effect as being absorbed in the sixth semiconductor layer region.

3. The solid-state light-receiving device for ultraviolet light according to claim 1, wherein the differential circuit is formed integrally with the first photodiode and the second photodiode in the semiconductor substrate.

4. The solid-state light-receiving device for ultraviolet light according to claim 3, wherein the differential circuit comprises a differential amplifier circuit.

5. An electronic device, comprising the solid-state light-receiving device for ultraviolet light of claim 1.

6. An electronic device according to claim 5, wherein the electronic device further has a communication function.

* * * * *